United States Patent
Maurelli et al.

[11] Patent Number: 5,936,276
[45] Date of Patent: Aug. 10, 1999

[54] SINGLE POLYSILICON LEVEL FLASH EEPROM CELL AND MANUFACTURING PROCESS THEREFOR

[75] Inventors: Alfonso Maurelli, Sulbiate; Carlo Riva, Renate, both of Italy

[73] Assignee: STMicroelectronics, S.r.l., Agrate Brianza, Italy

[21] Appl. No.: 08/883,405

[22] Filed: Jun. 26, 1997

[30] Foreign Application Priority Data

Jul. 18, 1996 [EP] European Pat. Off. .............. 96830398

[51] Int. Cl.$^6$ .................................................. H01L 29/72
[52] U.S. Cl. .......................... 257/318; 257/315; 257/316; 257/506
[58] Field of Search .................................. 257/315, 316, 257/318, 506

[56] References Cited

U.S. PATENT DOCUMENTS 4,019,197  4/1977  Lohstroh et al. ..................... 257/315

FOREIGN PATENT DOCUMENTS

| 0120303 A2 | 10/1984 | European Pat. Off. . |
| 0142252 A2 | 5/1985 | European Pat. Off. . |
| 0471131 A1 | 2/1992 | European Pat. Off. . |

*Primary Examiner*—Edward Wojciechowicz
*Attorney, Agent, or Firm*—David V. Carlson; Seed and Berry LLP

[57] ABSTRACT

A flash EEPROM memory cell comprises source and drain regions defining a channel region therebetween, a floating gate and a control gate. The source and drain regions are first and second doped semiconductor regions of a first conductivity type formed in a first active area region of a semiconductor material layer of a second conductivity type; the control gate comprises a third doped semiconductor region of the first conductivity type formed in a second active area region of the semiconductor material layer; and the floating gate comprises a polysilicon strip insulatively disposed over the channel region and insulatively extending over the third doped semiconductor region.

11 Claims, 4 Drawing Sheets

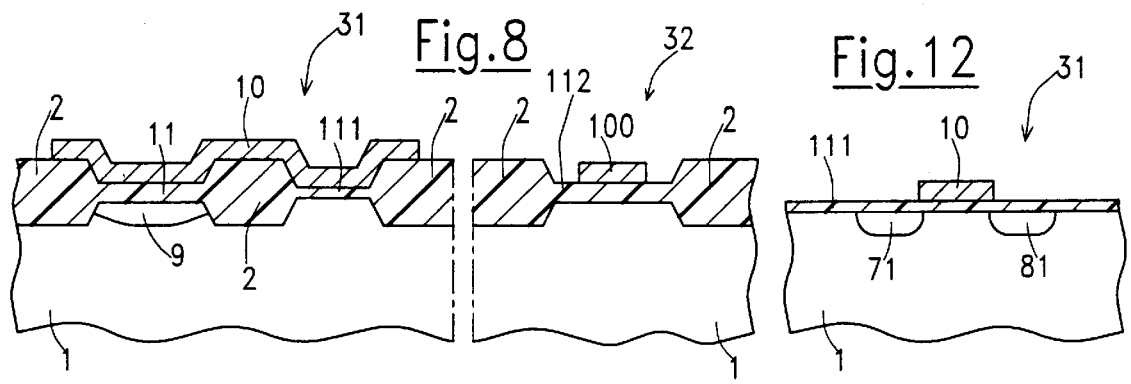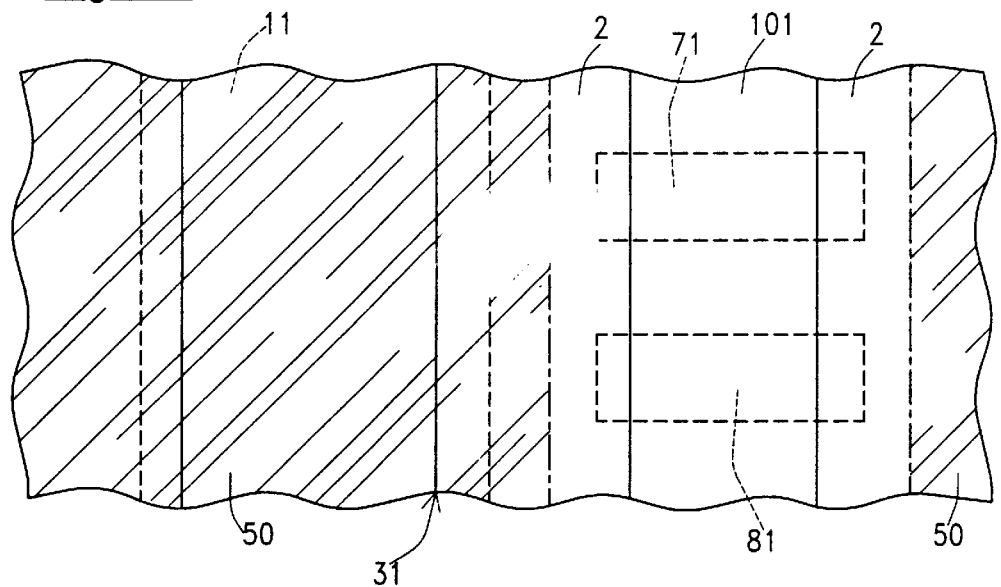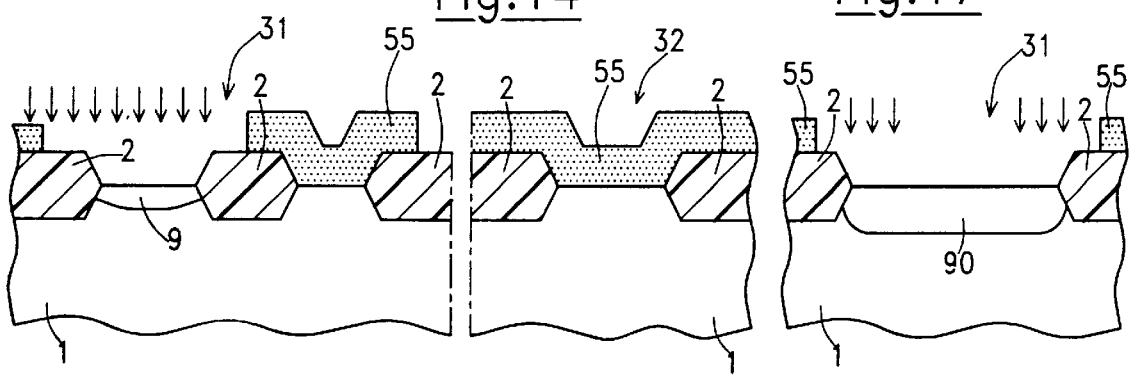

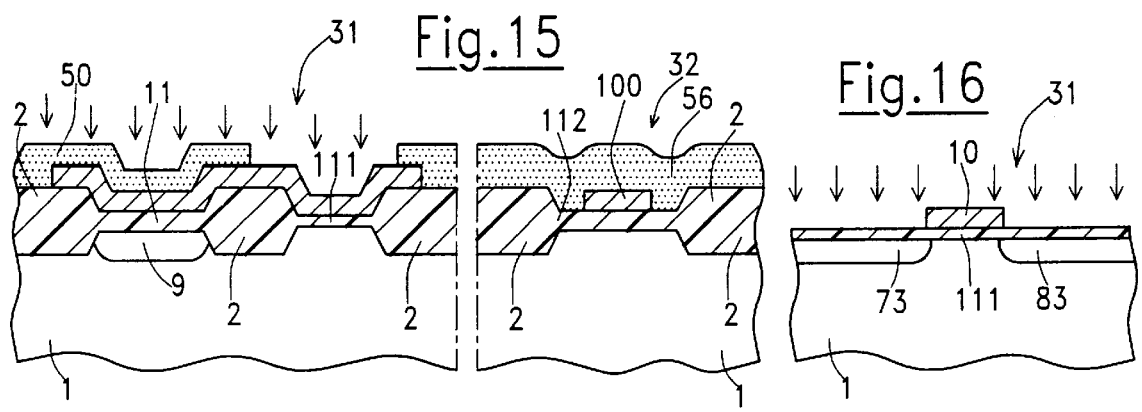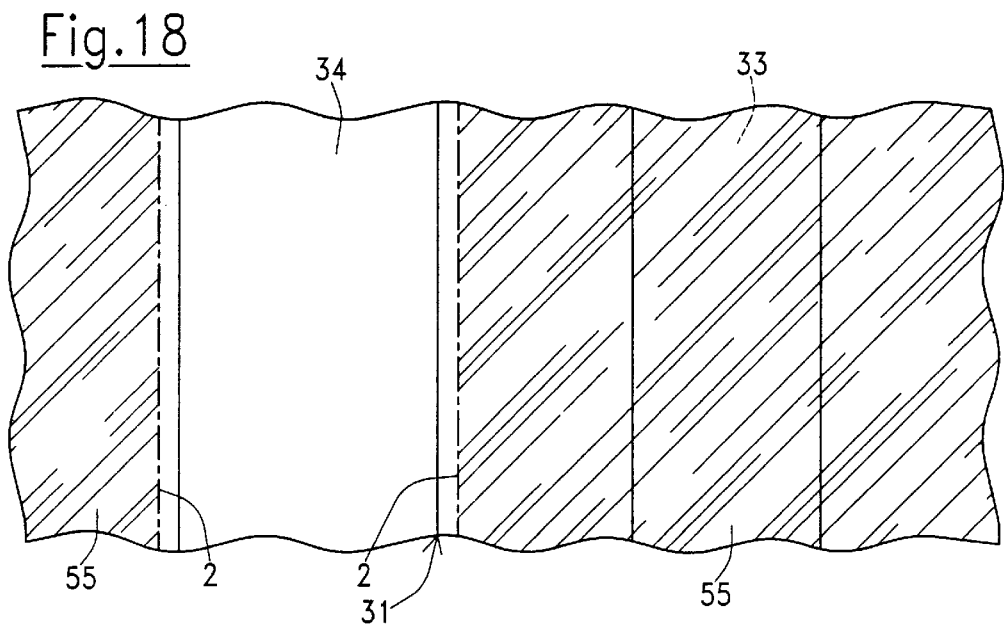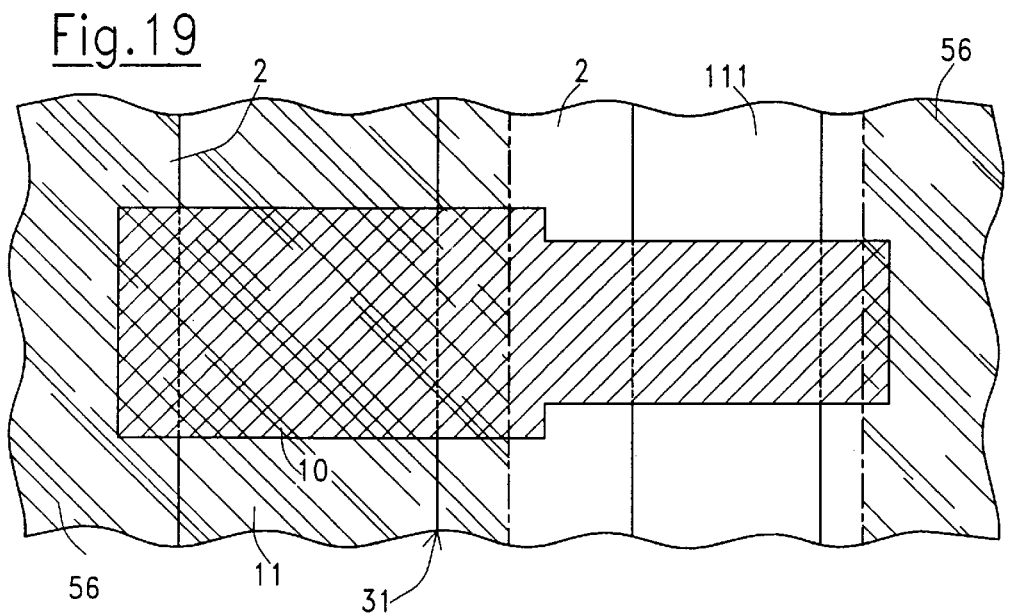

SINGLE POLYSILICON LEVEL FLASH EEPROM CELL AND MANUFACTURING PROCESS THEREFOR

TECHNICAL FIELD

The present invention relates to a single polysilicon level flash EEPROM cell, and to a manufacturing process for obtaining the same.

BACKGROUND OF THE INVENTION

It is known that a flash EEPROM cell is a memory cell that can be electrically programmed and electrically erased. The cell comprises source and drain electrodes, a floating gate and a control gate. Programming of the memory cell involves injection of hot electrons from the drain electrode into the floating gate, where the electrons get trapped. Erasure is achieved by means of Fowler-Nordheim tunneling of electrons from the floating gate normally to the source electrode.

Conventional flash EEPROM cells are stacked-gate devices wherein the floating gate is formed of a first level of polysilicon isolated from the semiconductor substrate by means of an oxide layer, and the control gate is formed of a second level of polysilicon isolated from the floating gate by means of a dielectric layer.

In order to fabricate flash EEPROM devices, manufacturing processes providing for two levels of polysilicon are necessary, and the number of additional masks with respect to a conventional CMOS manufacturing process is rather high.

Consequently, conventional flash EEPROM devices are rather costly.

In view of the state of the art described, it is an object of the present invention to provide a flash EEPROM memory cell which is simpler and cheaper to be fabricated that conventional flash EEPROM cells.

SUMMARY OF THE INVENTION

According to the present invention, such object is achieved by means of a flash EEPROM memory cell comprising source and drain regions defining a channel region therebetween, a floating gate and a control gate, characterized in that said source and drain regions are first and second doped semiconductor regions of a first conductivity type formed in a first active area region of a semiconductor material layer of a second conductivity type, said control gate comprises a third doped semiconductor region of the first conductivity type formed in a second active area region of the semiconductor material layer, and the floating gate comprises a polysilicon strip insulatively disposed over said channel region and insulatively extending over said third doped semiconductor region.

The flash EEPROM cell of the present invention can be fabricated by means of a process providing for:

forming in a semiconductor layer of a first conductivity type a first and a second active area regions delimited by field oxide layer portions;

forming in said first active area region first and second doped semiconductor regions of a second conductivity type constituting a source and a drain of the cell and defining therebetween a channel region, and forming in the second active area region a third doped semiconductor region of the second conductivity type constituting a control gate of the cell;

insulatively forming over the channel region and over the third doped region a strip of polysilicon constituting a floating gate of the cell.

The flash EEPROM memory cell according to the present invention has a single polysilicon level; thanks to this, it is simpler and cheaper to be fabricated. In fact, it can be fabricated by means of conventional CMOS processes with the addition of only a few dedicated masks. For example, in CMOS processes providing for the integration of capacitors, the source and drain regions and the control gate region of the cell can be formed by means of the same implant used to form the capacitors. The formation of the floating gate of the cell can be accomplished simultaneously with the formation of gates of MOS transistors: if the thickness of the oxide layer which insulates the gate of the MOS transistors from their channels is sufficiently low, said oxide layer can also form the tunnel oxide layer for the flash EEPROM cell, otherwise a single additional mask is necessary to form the tunnel oxide layer for the cell. In alternative, the formation of the control gate region of the cell can be obtained using the same implant step provided in all CMOS processes for the formation of well regions in the substrate for the integration of MOS transistors, and the formation of the source and drain regions of the cell can be achieved by means of a dedicated masked implant; in this case, even if a further additional mask is necessary, the performances of the memory cell can be improved. Even better performances can be achieved by forming the control gate using the capacitor implant, and forming the source and drain regions of the cell by means of said dedicated implant: since the capacitor implant has generally an implant dose higher than that of the implant for the formation of the well regions, the capacitive coupling between the floating gate and the control gate is higher, and the area of the cell can be reduced.

The features of the present invention will be made more evident by the following detailed description of some embodiments thereof, described as non-limiting examples in the annexed drawings.

BRIEF DESCRIPTION OF THE DRAWINGS

FIGS. 4 to 8 show steps of a first embodiment of a process for producing the flash EEPROM cell of FIG. 1 and the external circuit transistor, seen in cross-sectional views similar to that of FIG. 2.

FIGS. 9 to 12 show steps of the above-mentioned process corresponding to those of FIGS. 5 to 8, seen in cross-sectional views similar to that of FIG. 3.

FIG. 13 is a top-plan view showing the layout of one of the masks utilized in said manufacturing process.

FIGS. 14 and 15 show some steps of a manufacturing process according to a second embodiment of the invention, seen in cross-sectional views similar to that of FIG. 2.

FIG. 16 shows in cross-sectional view similar to that of FIG. 3 a process step corresponding to that shown in FIG. 8.

FIG. 17 shows in cross-sectional view another external circuit transistor at a process step corresponding to that of FIG. 14.

FIGS. 18 and 19 are top-plan views showing two masks utilized in said second embodiment of manufacturing process.

DETAILED DESCRIPTION OF THE DRAWINGS

Figure 1:
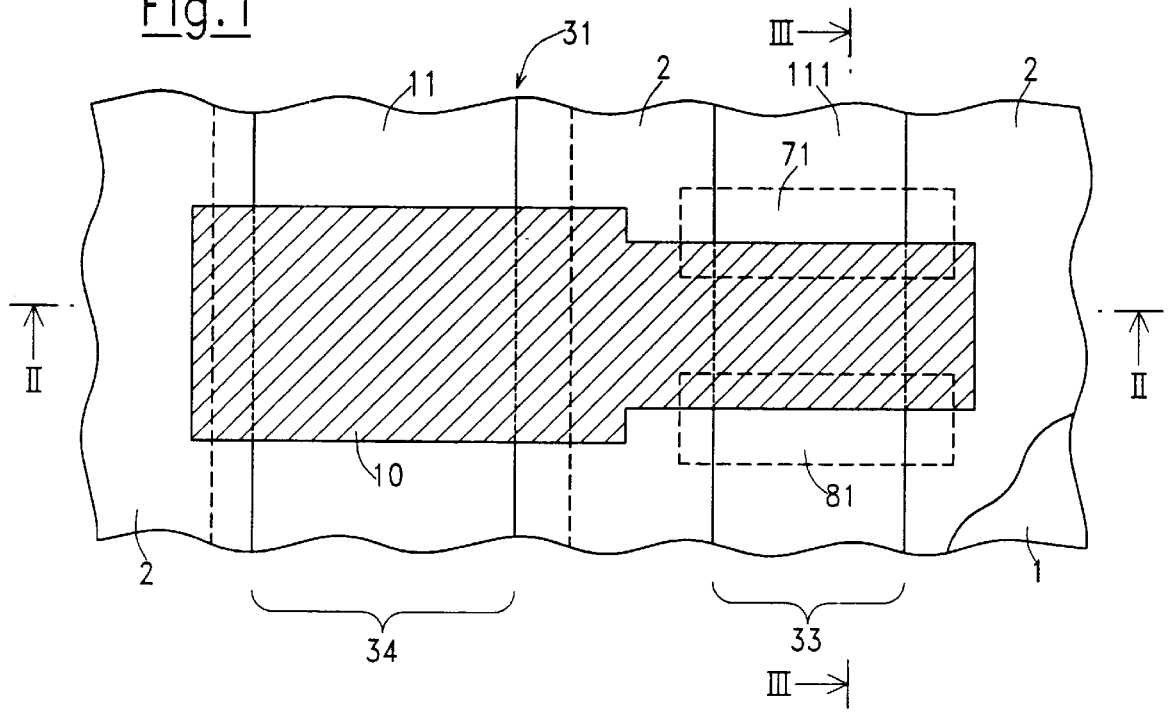
FIG. 1 is a top-plan view of a flash EEPROM cell according to an embodiment of the present invention.
Figure 2:
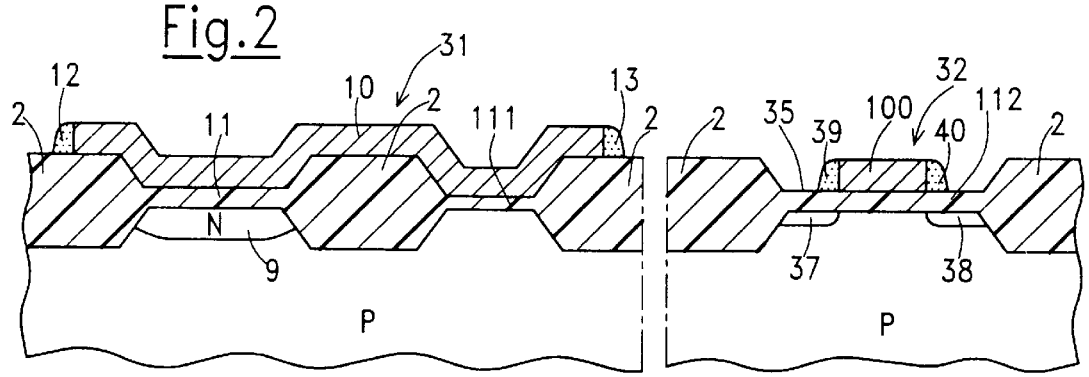
FIG. 2 is a cross-sectional view taken along line II—II in FIG. 1, completed with a similar cross-sectional view of an external circuit transistor.
Figure 3:
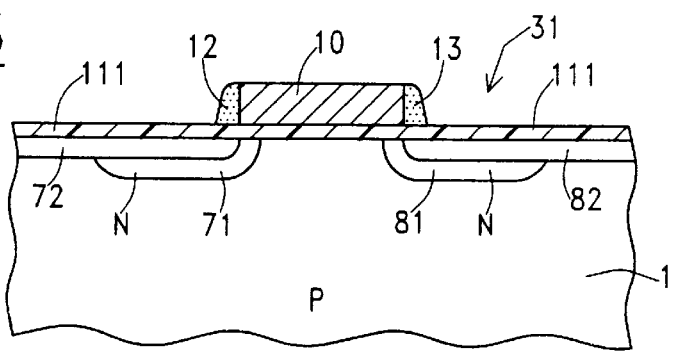
FIG. 3 is a cross-sectional view taken along line III—III of FIG. 1.

With reference to the drawings, and particularly to FIGS. 1, 2 and 3, with the reference numeral 31 there is indicated an area of a semiconductor chip wherein a flash EEPROM memory cell according to the present invention is formed, and with the reference numeral 32 an area of the same chip wherein a conventional N-channel MOSFET is formed.

The flash EEPROM cell, which in this example is assumed to be of the N channel type, comprises N type source and drain regions 71, 72 and 81, 82 formed in a P type semiconductor substrate 1 in a first active area region 33 delimited by thick field oxide layer portions 2, an N type control gate diffusion 9 formed in substrate 1 in a second active area region 34 substantially parallel to the first active area region 33, a gate oxide layer 11 covering the second active area region 34 and a tunnel oxide layer 111, usually thinner than the gate oxide layer 11, covering the first active area region 33. A polysilicon floating gate 10 extends transversally to the first and second active area regions 33, 34; in the second active area region 33 the polysilicon floating gate 10 is isolated from the control gate diffusion 9 by means of the gate oxide layer 11; in the first active area region 33 the polysilicon floating gate 10 is isolated from the substrate 1 and from the source and drain regions 71 and 81 by means of the tunnel oxide layer 111.

The N-channel MOSFET is similarly formed in a respective active area region 35 also delimited by thick field oxide layer portions 2, wherein N type source and drain regions 37 and 38 are formed in substrate 1; a gate oxide layer 112 covers the substrate 1 and a polysilicon gate 100 is disposed over the gate oxide layer 112.

Differently from conventional flash EEPROM memory cells, the flash EEPROM memory cell of the present invention is not a stacked-gate device, because the control gate is not superimposed over the floating gate. In other words, while conventional flash EEPROM cells are double polysilicon level devices, the flash EEPROM cell of the present invention is a single polysilicon level device. However, the operation of the single polysilicon level cell of the present invention is similar to that of conventional flash EEPROM cells: in write mode, a voltage of 8 to 12 V is applied to the control gate diffusion, a voltage of 3 to 5 V is applied to the drain region and the source region is kept grounded; hot electrons generated in the channel region of the memory cell (the region of substrate 1 comprised between the source and drain regions) are injected into the floating gate 10, where they get trapped; in erase mode, the control gate is kept grounded, the drain region is left floating and a voltage of 8 to 12 V is applied to the source region; electrons trapped in the floating gate 10 tunnel (Fowler-Nordheim tunnel effect) through the tunnel oxide layer into the source region. In read mode, a voltage of approximately 5 V is applied to the control gate, the drain region is biased at approximately 1 V and the source region is kept grounded.

Figure 4:
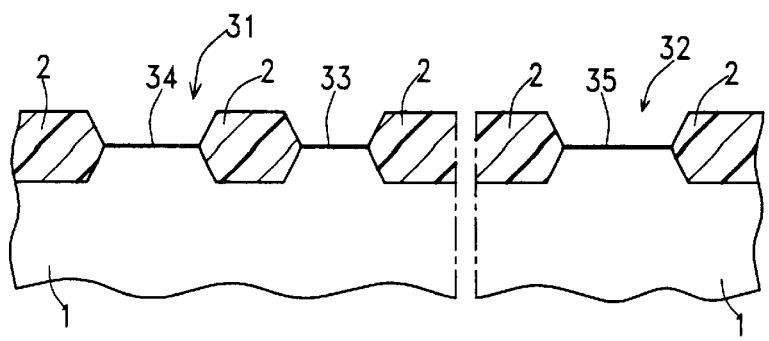

According to a first embodiment of manufacturing process shown in FIG. 4, a field oxide layer 2 is selectively formed over substrate 1, for example by means of the known LOCOS technique. In region 31, field oxide layer 2 is not formed over the active area regions 33 and 34; similarly, in region 32, field oxide layer 2 is not formed over active area region 35.

Figure 5:
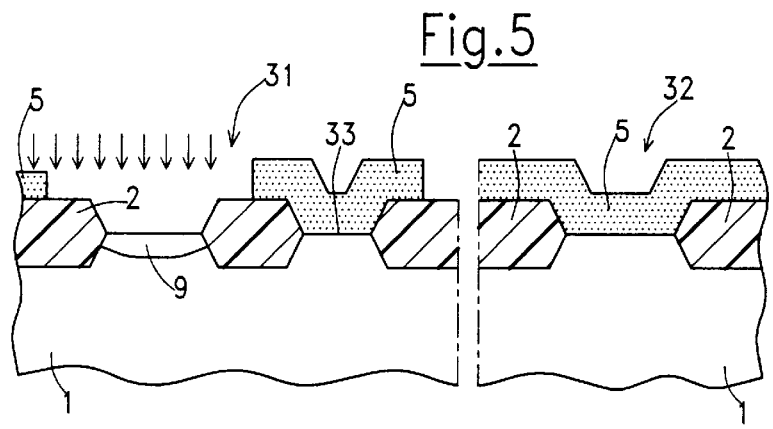
Figure 9:
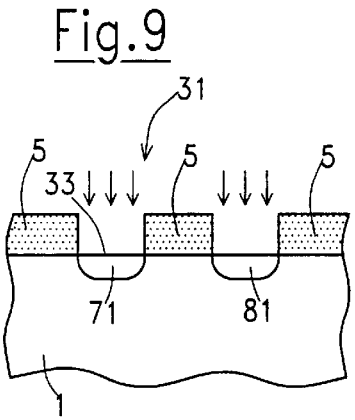

As shown in FIGS. 5 and 9, after the application of a resist mask 5 which completely covers region 32 and partially covers active area region 33, there is performed an implantation of an N type dopant, typically arsenic or phosphorus in a dose of approximately 1E14 to 1E15 atoms/cm$^2$, for the creation of the control gate diffusion 9 and of the source and drain regions 71 and 81 of the flash EEPROM cell, which thus define a channel region between them. This implant, with these doses, can be normally provided in conventional CMOS processes in order to create capacitors; in this case, no additional mask is necessary. If instead no capacitors are to be formed in the chip, a dedicated mask is required.

Figure 6:
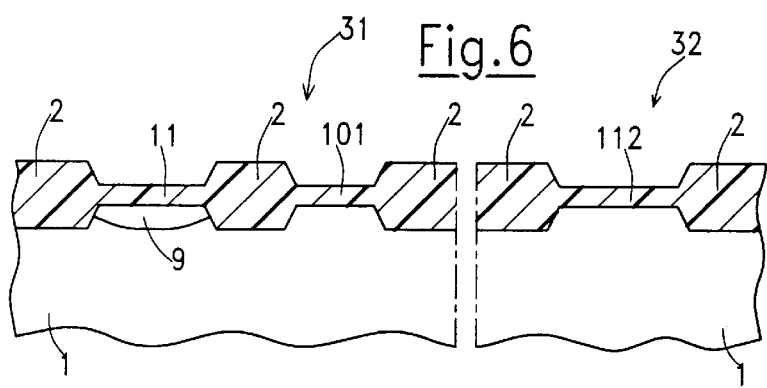
Figure 10:
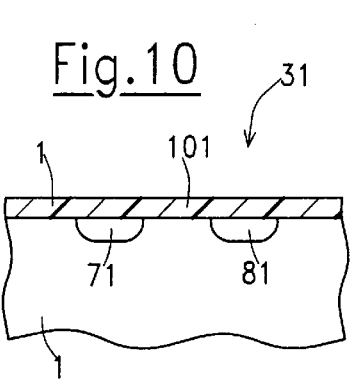

Once the resist mask 5 has been removed, a gate oxide layer 11, 101, 112 with thickness of, normally, 200 Angstroms is formed, e.g. by thermal oxidation, over the active area regions 33, 34 and 35, respectively (FIGS. 6 and 10).

Figure 7:
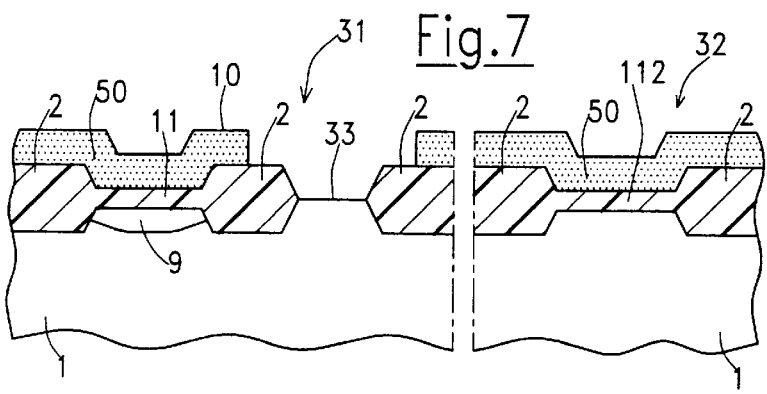
Figure 11:
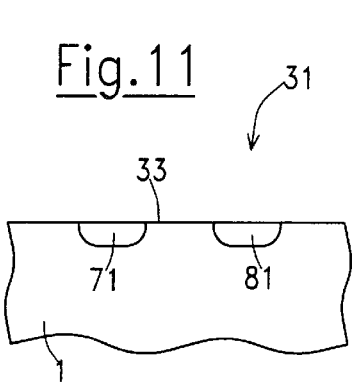

A resist mask 50 is then formed which leaves uncovered only the active area region 33 (FIG. 13). The gate oxide layer 101 in region 33 is then removed (FIGS. 7 and 11), and a thinner tunnel oxide layer 111 is subsequently formed, e.g. by thermal growth, over active area region 33, the tunnel oxide layer having a thickness of approximately 80 to 140 Angstroms.

A polysilicon layer is then deposited and selectively removed to define the floating gate 10 of the flash EEPROM cell and the gate 100 of MOSFET 32 (FIGS. 8 and 12).

An N type dopant, preferably phosphorus, is then implanted in a dose of approximately 1E13 to 5E13 atoms/cm$^2$ in the active area region 33 to form regions 72 and 82 of source and drain of the memory cell aligned with the floating gate of the cell; by means of this same implant, in the area of transistor 32 the source and drain regions 37 and 38 are created.

Insulating material spacers 12, 13 and 39, 40 are then formed at the sides of the polysilicon floating gate 10 of the memory cell as well as at the sides of the polysilicon gate 100 of transistor 32.

Conventionally, the memory cell and the transistor are then implanted with an N type dopant, preferably arsenic in a dose of approximately 1E15 to 5E15 atoms/cm$^2$, in a self aligned manner with the spacers 12, 13 and 39, 40.

It appears that, when compared to a conventional CMOS manufacturing process, the process of the present invention requires at most two additional mask, i.e., the one for the dopant implantation for creating the control gate diffusion 9 and the source and drain regions 71 and 81 of the cell, and the one for the removal of the gate oxide layer 101 where the tunnel oxide layer is to be formed.

If the CMOS process already provides for the formation of capacitors, the control gate diffusion and the source and drain regions of the memory cells can be formed by means of the implant step used to create capacitors, so that in this case only one additional mask is necessary for the fabrication of the memory cell.

If moreover in the same chip EEPROM memory cells are to be integrated, the mask for the selective etching of the gate oxide layer is already provided in the manufacturing process for the definition of tunnel oxide areas of the EEPROM cells; in this case, no additional masks at all are required.

It is also worth noting that, in integrated circuits of the next generations with higher integration densities, the thickness of the gate oxide layers of the MOS transistors will be lower than the current 200 Angstroms; in particular, the gate oxide layers could have a thickness approximately equal to that of the tunnel oxide layers. In this case, in the manufacturing process previously described it would not be necessary to selectively etch the gate oxide layer to form the tunnel oxide layer, so that one more mask could be eliminated. In this case, if the process already provides for the formation of capacitors, no additional masks at all would be necessary to form the flash EEPROM cell of the present invention.

In a second embodiment of the manufacturing process, the control gate diffusion 9 is formed by means of a masked implant of an N type dopant, preferably phosphorus, in a dose of approximately 5E12 to 2E13 atoms/cm$^2$. Such an implant is conventionally provided in CMOS manufacturing processes for the creation of N type well regions 90 (FIG. 17) wherein the P-channel MOSFETs are to be integrated. This implant, due to the low implant dose, is not suitable for forming also the source and drain regions of the flash EEPROM cell, so the active area region 33 shall be masked by means of a resist mask 55 (FIG. 18); also the region 32 of the N channel MOSFET is to be masked (FIG. 14).

After the growth of the gate oxide layer, selective etching in the active area region 33 as described in connection with the first embodiment of manufacturing process occurs. Then after, the growth of the tunnel oxide layer and the deposition and etching of the polysilicon layer, a resist mask 56 is formed (FIGS. 15 and 19) and an implant of N type dopants, preferably arsenic plus phosphorus in respective doses of 1E15 to 5E15 atoms/cm$^2$ and 5E13 to 5E14 atoms/cm$^2$ and at respective energies of 20 to 50 KeV and 30 to 100 KeV, is performed to form source and drain regions 73 and 83 of the memory cell.

The process then continues in the same way as in the previous embodiment.

With respect to the first embodiment, the memory cell fabricated according to the second embodiment of manufacturing process has better performance. In fact, the dedicated arsenic and phosphorus implant used to form the source and drain regions of the memory cell allows a lower current related to band-to-band tunneling (BBT) during electrical erasure of the memory cell.

In a third embodiment, the manufacturing process provides, as in the first embodiment, for forming the control gate diffusion 9 of the memory cell exploiting the implant that can be provided in a CMOS process for the creation of capacitors. However, unlike the first embodiment, the source and drain regions of the memory cell are not formed by means of this implant simultaneously with the control gate diffusion. The source and drain regions of the memory cell are instead formed in the same way as in the second embodiment, i.e., by means of a dedicated implant of arsenic and phosphorus.

With respect to the second embodiment of the manufacturing process, the third embodiment reduces the area occupied by the memory cell. I In fact, since the implant dose used to form capacitors is generally higher than that used to create N type wells, the doping level of the control gate diffusion is higher; this allows a higher capacitive coupling between the control gate diffusion and the floating gate even if the area of superposition between the former and the latter is reduced.

In the third embodiment of the manufacturing process, the number of additional masks with respect to a conventional CMOS process is at most three, i.e., the mask for the formation of the control gate diffusion of the memory cell (in the case the CMOS process does not already provide for the formation of capacitors), the mask for the selective etching of the gate oxide layer over the channel region of the memory cell, and the mask for the dedicated implant of arsenic and phosphorus for the formation of the source and drain regions of the memory cell. However, if the CMOS process already provides for the formation of capacitors, only two additional masks are required.

We claim:

1. A flash EEPROM memory cell, comprising:

in a semiconductor material layer of a second conductivity type, a control gate comprising a first doped semiconductor region of a first conductivity type formed in a first active area region of the semiconductor material layer, the first doped semiconductor region extending in a first direction;

source and drain regions comprising a second and a third doped semiconductor region of the first conductivity type formed in a second active area region of the semiconductor material layer, the second and third doped semiconductor regions spaced apart in said first direction for defining a channel region therebetween; and a floating gate comprising a polysilicon strip extending in a second direction substantially orthogonal to the first direction, the polysilicon strip insulatively disposed over said channel region and insulatively disposed over said first doped semiconductor region.

2. The flash EEPROM cell according to claim 1, wherein said polysilicon strip forming the floating gate is isolated from the channel region and the third doped semiconductor region by means of respective first and second oxide layers.

3. The flash EEPROM cell according to claim 1, wherein said first oxide layer has a thickness suitable to allow tunneling of electrons from the polysilicon strip to either one of said first and second doped semiconductor regions.

4. The flash EEPROM cell according to claim 1, wherein said first oxide layer has a thickness of approximately 80 to 140 Angstroms.

5. The flash EEPROM cell according to claim 1, wherein said second oxide layer has a same thickness as the first oxide layer.

6. The flash EEPROM cell according to claim 1, wherein said first and second oxide layers have a thickness of approximately 80 to 140 Angstroms.

7. The flash EEPROM cell according to claim 1 wherein said first and second active area regions are delimited by field oxide layer portions.

8. The flash EEPROM cell according to claim 1 wherein said first conductivity type is the N type and said second conductivity type is the P type.

9. A flash EEPROM memory cell comprising:

a substrate;

a first and a second active region in the substrate separated by an insulating barrier;

a source region and a drain region formed in the first active region and separated by a channel, the source and drain regions spaced from each other in a first direction;

a control gate diffusion positioned in the second active area; and a floating gate disposed over the control gate diffusion, and extending in a second direction to the source and drain regions, the floating gate separated from the control gate diffusion by a first oxide, and separated from the source and drain regions by a second oxide, the floating gate extending farther in the second direction than the first direction.

10. The EEPROM memory of claim 9 wherein the second oxide over the active region is approximately between 80–140 Angstroms.

11. A flash EEPROM memory cell comprising:

a substrate having first and second active regions separated by a barrier;

a source and a drain disposed in the first active region and separated from each other by a channel, the length of the channel extending in a first direction;

a control gate separated from the first region by the barrier; and a floating gate disposed over the control gate and extending in a second direction to the source and the drain, the floating gate separated from the control gate by a first oxide, and separated from the source and the drain by a second oxide, the floating gate extending farther in the second direction than the first direction.

* * * * *